United States Patent
Yamagishi

(10) Patent No.: US 10,600,534 B2
(45) Date of Patent: Mar. 24, 2020

(54) CABLE, DEVICE AND METHOD OF SUPPLYING POWER

(71) Applicant: Hiromitsu Yamagishi, Tokyo (JP)

(72) Inventor: Hiromitsu Yamagishi, Tokyo (JP)

(*) Notice: Subject to any disclaimer, the term of this patent is extended or adjusted under 35 U.S.C. 154(b) by 0 days.

(21) Appl. No.: 16/321,401

(22) PCT Filed: Sep. 15, 2017

(86) PCT No.: PCT/JP2017/033584
§ 371 (c)(1),
(2) Date: Jan. 28, 2019

(87) PCT Pub. No.: WO2018/056228
PCT Pub. Date: Mar. 29, 2018

(65) Prior Publication Data
US 2019/0362868 A1 Nov. 28, 2019

(30) Foreign Application Priority Data
Sep. 22, 2016 (JP) .................. 2016-184964

(51) Int. Cl.
*H01B 7/18* (2006.01)
*H01B 9/00* (2006.01)
*H02J 7/00* (2006.01)

(52) U.S. Cl.
CPC ............. *H01B 7/1875* (2013.01); *H01B 9/00* (2013.01); *H02J 7/0052* (2013.01)

(58) Field of Classification Search
CPC ........ H01B 7/1875; H01B 9/00; H02J 7/0052
See application file for complete search history.

(56) References Cited

U.S. PATENT DOCUMENTS 3,590,141 A * 6/1971 Mildner .................. H01B 7/288
  174/105 R
3,924,054 A * 12/1975 Falke ....................... H01B 7/29
  174/15.6

(Continued)

FOREIGN PATENT DOCUMENTS

GB      1040407 A     8/1966
JP      60-207219 A   10/1985

(Continued)

OTHER PUBLICATIONS

The First Office Action dated Apr. 3, 2019, from the State Intellectual Property Office of People's Republic of China in counterpart Application No. 201780004562.5.

(Continued)

*Primary Examiner* — Timothy J Thompson
*Assistant Examiner* — Amol H Patel
(74) *Attorney, Agent, or Firm* — Arent Fox LLP

(57) ABSTRACT

For the purpose of improving energy efficiency or improving sound quality, there is provided a cable, a power supply tap, a battery, a printed circuit board, a LSI/IC and the like comprising a hygroscopic fiber, an inorganic ion exchanger influence fiber, a supercritical influence fiber, a composite fiber obtained by mixing two or more among the mentioned fibers, or a hygroscopic resin, an inorganic ion exchanger influence resin, a supercritical influence resin, and a composite resin obtained by mixing two or more among the mentioned resins, and a power supply method of supplying power to a device or a battery.

9 Claims, 9 Drawing Sheets

(56) References Cited

U.S. PATENT DOCUMENTS

| | | | | |
|---|---|---|---|---|
| 4,008,368 A | * | 2/1977 | Leuchs | C08K 3/26 |
| | | | | 174/120 R |
| 4,308,416 A | | 12/1981 | Herman et al. | |
| 4,571,357 A | * | 2/1986 | Hata | B32B 27/10 |
| | | | | 428/153 |
| 4,679,317 A | * | 7/1987 | Bailleul | H01B 7/16 |
| | | | | 29/828 |
| 6,455,769 B1 | | 9/2002 | Belli et al. | |
| 2007/0115644 A1 | | 5/2007 | Kim et al. | |
| 2014/0126127 A1 | | 5/2014 | Yeh | |
| 2016/0268018 A1 | * | 9/2016 | Sica | H01B 3/006 |
| 2019/0229436 A1 | * | 7/2019 | Michelsen | C23C 24/04 |

FOREIGN PATENT DOCUMENTS

| | | |
|---|---|---|
| JP | 2002-280756 A | 9/2002 |
| KR | 10-2014-0127711 A | 11/2014 |

OTHER PUBLICATIONS

International Search Report and Written Opinion, issued by the International Searching Authority in corresponding International Application No. PCT/JP2017/033584, dated Jan. 16, 2018, (PCT/ISA/210 & PCT/ISA/237).

Communication dated Jan. 28, 2020, from the European Patent Office in counterpart European Application No. 17853001.0.

* cited by examiner

CABLE, DEVICE AND METHOD OF SUPPLYING POWER

RELATED APPLICATIONS

This application is a National Stage Entry of International Patent Application No. PCT/JP2017/033584, filed Sep. 15, 2017, which claims priority to Japanese Patent Application No. 2016-184964, filed Sep. 22, 2016. The disclosures of the priority applications are incorporated in their entirety herein by reference.

TECHNICAL FIELD

The present invention relates to a cable, a device and a method of supplying power.

BACKGROUND ART

In conventional electric devices, as shielding material, a metal material including aluminum such as aluminum diecast is generally used with regard to a housing, and a braided shield or a wound shield of copper wire for low frequencies and a tape shield of aluminum foil for high frequencies are widely used with regard to a cable. A shielding effect means a minus effect of shielding electromagnetic wave component, which becomes external noise, by dropping a potential to the ground with a grounded shield.

The inventor has found that, both in a battery-mounted electric device to be charged with an AC power supply and in an ordinary electric device to work with an AC power supply, an influence of inherent frequency of an AC power supply used therefor causes a problem that energy efficiency of electrons flowing in such electric device is lower, as described below.

Since conventional electric devices are sourced from an AC power supply with a single frequency, which is, for example, 50 Hz or 60 Hz in Japan, there is the problem that energy efficiency of electrons flowing in the electric device is lower. This event also occurs in a battery-mounted electric device, that is, the same problem that energy efficiency of electrons recorded in the battery is lower is caused, being affected by the influence of a single frequency of an AC power supply at the time of charging an original battery.

Conventionally, it has been thought that electrons are definitely homogeneous in their own level and a concept of differences in quality of electrons does not exist.

SUMMARY OF INVENTION

Technical Problem

The present invention has been made in view of the background described above, and it is intended to improve energy efficiency of devices or the like, or to improve sound quality.

Solution to Problem

An aspect in accordance with the present invention provides a cable comprising: an original cable having an insulating sheath as an outermost layer; a first material provided on the insulating sheath of the original cable; and a metal sheath provided on the first material and made of aluminum, magnesium, copper, rhodium, silver or gold, wherein the first material is at least one of a hygroscopic fiber, an inorganic ion exchanger influence fiber, a supercritical influence fiber, a composite fiber obtained by mixing two or more among the mentioned fibers, a hygroscopic resin, an inorganic ion exchanger influence resin, a supercritical influence resin, and a composite resin obtained by mixing two or more among the mentioned resins.

Advantageous Effects of Invention

The present invention may be effective to improve energy efficiency of devices or the like, or to improve sound quality.

BRIEF DESCRIPTION OF DRAWINGS

FIG. 1 shows a structure of a cable body 1 according to a First Embodiment of the present invention, wherein

FIG. 2 shows a structure of a power supply tap 11 according to a Second Embodiment of the present invention, wherein

FIG. 3 shows a structure of a battery according to a Third Embodiment of the present invention, wherein

FIG. 4 shows a structure of a printed circuit board according to a Fourth Embodiment of the present invention, wherein

FIG. 5 shows a structure of another electric component such as an LSI/IC according to a Fifth Embodiment of the present invention, wherein

DESCRIPTION OF EMBODIMENT

First Embodiment

Figure 1A:
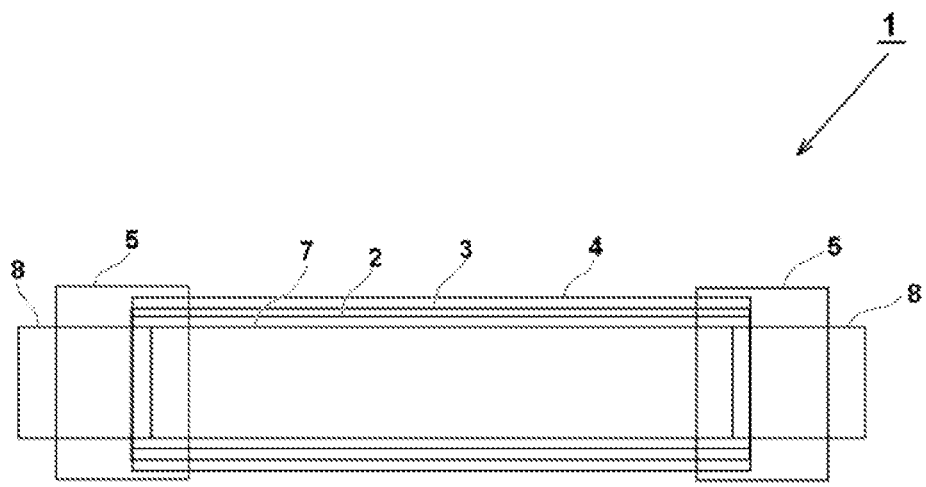
FIG. 1A is a front transparent view and FIG. 1B is a side transparent view.
Figure 1B:
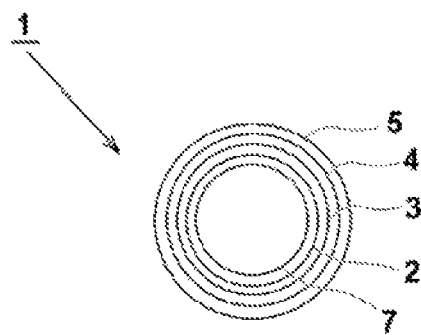

A First Embodiment is an embodiment in which the present invention is applied to a cable body 1. FIGS. 1A and 1B illustrate a structure thereof in transparent views and are schematically drawn enlarging spaces between each material for the sake of explanation, but materials are actually in close contact with each other. Here, a hygroscopic fiber 2 (also referred to as a first material) which is cut to a size of [a maximum circumferential length]×[a cable length] is wound around an outer circumference of an insulating envelope of an existing cable 7, and an aluminum tape as a sheath 4 for fixing is carefully wound in spiral over the entire outermost circumference of the cable 7 inclusive of a part of each connector 8 resulting in tubular shape. Any cable such as a power supply cable, a digital signal cable or an analog signal cable may be applicable to the cable 7. The sheath 4 is fixed to the connectors 8 at both ends of the cable with a heat shrinkable tube 5. Although the heat shrinkable tube 5 is schematically drawn in straight line in FIG. 1A, it actually shrinks to the circumference of the connectors and comes into close contact. Here, in order to further improve the performance, a conductive fiber 3 such as THUNDERON (a trade name and a registered trademark) made by Nihon Sanmo Dyeing Co., Ltd. may be superimposed and wound on the hygroscopic fiber 2. It is preferable to make the conductive fiber 3 longer than the cable 7, but the effect may be sufficiently increased even if it is made shorter and used partially.

First, a hygroscopic fiber/resin (namely, a hygroscopic fiber or a hygroscopic resin) of the present invention is defined as a polymer fiber/resin obtained by polymerizing a carboxyl group or a hydrophilic group of carboxyl group salt using a natural fiber/resin or a synthetic fiber/resin as a raw material. A fiber having a surface area larger than a resin is preferable in view of a hygroscopic effect. Types of fiber/resin as the raw material are regardless in order to develop the effect, but in order to further increase the effect of the present invention, as the polymer fiber obtained by polymerizing the hydrophilic group, a sodium polyacrylate-based fiber which is obtained by hydrolyzing an acrylic fiber with a sodium hydroxide aqueous solution is generally most preferred as a main stream. Incidentally, it is usual to perform a crosslinking treatment by graft copolymerization with a hydrazine-based compound, which is a general crosslinking monomer, to the polymer fiber having the hydrophilic group to be polymerized.

As a technique of enhancing the effect of the present invention, it is preferable to configure a conductive fiber/resin carrying a conductive metal. The technique of carrying a conductive metal may be realized by directly carrying it in the form of a complex, directly carrying it by adsorption, or indirectly carrying it on a fiber/resin with an inorganic silicon compound, a phosphate, a sulfonate or the like. In place of the hygroscopic fiber/resin of the present invention, a fiber/resin carrying an inorganic ion exchanger other than the hygroscopic fiber/resin may be used, or in order to further enhance the effect a hygroscopic fiber/resin carrying an inorganic ion exchanger may be used. The inorganic ion exchanger is preferably a zirconium phosphate, a zeolite, a silica gel, a hydroxyapatite, a titanium phosphate (titania phosphate), a tungsten oxide or the like. In this case also, it is preferable to perform a crosslinking treatment to the fiber/resin carrying the inorganic ion exchanger with a hydrazine-based compound. And, as well as the case of the hygroscopic fiber/resin, it is preferable that the fiber/resin carrying an inorganic ion exchanger further carries a conductive metal.

With regard to examples of the hygroscopic fiber/resin of the present invention, MOISFINE (a trade name and a registered trademark) made by Toyobo Co., Ltd. and BELLOASIS (a trade name and a registered trademark) made by Teijin Limited may be cited as representative examples available on the market, which are a crosslinked sodium polyacrylate-based hygroscopic fiber to make the effect highest. Although these are mainly used as a hygroscopic sheet to be laid under a futon (Japanese-style mattress), a completely new effect has been found in the present invention.

In addition, cited may be similar fibers such as BREATHTHERMO (a trade name and a registered trademark) made by Mizuno Corporation, EKS (a trade name and a registered trademark) made by Japan Exlan Co., Ltd., HEATTECH (a trade name and a registered trademark) made by Fast Retailing Co., Ltd., HEATFACT (a trade name and a registered trademark) made by Aeon Co., Ltd., BODYHEATER (a trade name and a registered trademark) made by Ito-Yokado Co., Ltd., iHEAT (a trade name and a registered trademark) made by Japana Co., Ltd., MOISCARE (a trade name and a registered trademark) made by Toyobo Co., Ltd. or the like, which are a crosslinked acrylic hygroscopic heat generating fiber.

These are for use to absorb sweat of clothes and release it as heat energy outward, and a heat generating function does not affect the effect of the present invention, but a hygroscopic function affects the effect thereof. Since it is effective not by mere water but by a mechanism of physical function of moisture absorbing and releasing, a resin in solid state may be used as long as it is made of a moisture absorbing and releasing material. However, a fiber in reticular state has a moisture absorbing and releasing performance higher therethan in the present situation, so a hygroscopic fiber is preferred.

Here, in case that a treatment of carrying a conductive metal is added to improve the performance, the treatment of carrying a conductive metal may be easily performed by spraying a silver ion nano-colloidal solution of NANOPURE M-02 (a trade name) made by Japan Ion Corporation directly onto a fiber/resin such as MOISFINE (a trade name and a registered trademark) or BELLOASIS (a trade name and a registered trademark). Further, in case that a treatment of influencing an inorganic ion exchanger is added to improve more the performance, the treatment of influencing an inorganic ion exchanger may be performed by spraying a tungsten oxide-containing liquid of RENECAT (a trade name and a registered trademark) made by Toshiba Corporation as an example directly onto a fiber/resin. Instead of this treatment, it is also possible to use a fiber/resin onto which pure water filtered through a reverse osmosis membrane filter and an ion exchange membrane filter is sprayed directly, and the fiber/resin treated in this manner is also regarded as an inorganic ion exchanger influence fiber/resin in the definition of the present invention. Since substances having no charge such as organic matters and fine particles may not be completely removed by the ion exchange membrane filter, impurities are removed by combining the reverse osmosis membrane filter.

In order to further improve the performance to a hygroscopic fiber/resin, a porous treatment is performed in a supercritical manner to a fiber/resin as described in Japanese Unexamined Patent Application Publication No. 2010-13791. In a pressurizing treatment thereof, carbon dioxide is injected into a supercritical carbon dioxide reaction system made by Jasco Corporation to treat the fiber/resin for 1 hour at temperature of 40° C. This is to finally treat the hygroscopic fiber/resin to improve overall performance. Although it is possible to perform the porous treatment in a supercritical manner individually to the fiber/resin at a raw material stage, it is more advantageous in cost and effect to efficiently perform such treatment to the fiber/resin at a final stage, so priority is given to the case of performing to the hygroscopic fiber/resin at final stage. In place of the porous treatment in a supercritical manner to the fiber as described in Japanese Unexamined Patent Application Publication No. 2010-13791, the fiber is replaced with water, and carbon dioxide is injected into the supercritical carbon dioxide reaction system made by Jasco Corporation to treat the water for 1 hour at temperature of 40° C. Then, the porous treatment in a supercritical manner to the fiber/resin may be performed by spraying such water returned to normal temperature and normal pressure after treated in a supercritical manner onto the fiber/resin.

The conductive fiber 3 is to enhance further quantitatively the conductive fiber. The conductive fiber 3 is a fiber with conductivity carrying copper sulfide on an acrylic fiber or a nylon fiber, and it is, in the present embodiment, introduced so as to raise a quantum energy level completely different from an antistatic function of an original use. An aluminum tape is an example to be used as the sheath 4, but any tape may be used as long as it is capable of adhering. For example, a copper tape may be used to enhance conductivity. An aluminum tape is suitable for countermeasures against a high frequency system such as a video, digital signals or the like, a copper tape or a gold tape is suitable for countermeasures against a low frequency system such as audio range signals. A silver tape is suitable for all-round countermeasures in any range. Corresponding to a length of the hygroscopic fiber 2, a length of the tape of the sheath 4 is shortened.

The First Embodiment is a simple embodiment that may be carried out by an amateur himself, but in case of a cable manufacturer, as the sheath 4, a braided tube made of polyester or the like which is generally used as a sheath in processing of cable products may be passed through.

Second Embodiment

A Second Embodiment is an embodiment in which the present invention is applied to a power supply tap 11. A shield of a housing of a power supply tap exclusive for an audio in general is realized by making a housing 19 of the power supply tap 11 out of a material containing aluminum such as aluminum die-cast and then connecting a ground line to the aluminum die-cast of the housing 19. In the present invention, a means of adhering a hygroscopic fiber 12 having material properties same to that of the hygroscopic fiber exemplified in the First Embodiment to the housing 19 of the power supply tap 11 is provided for a new quantum effect completely different from the shielding effect. The structure of the hygroscopic fiber 12, a method of carrying conductivity on the hygroscopic fiber 12, a method of influencing an inorganic ion exchanger, and a method of performing porous treatment in a supercritical manner are exactly same to those of the hygroscopic fiber 2 of the First Embodiment.

Figure 2A:
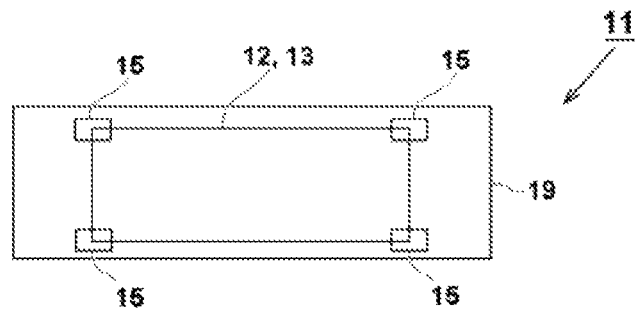
FIG. 2A is a top view.
Figure 2B:
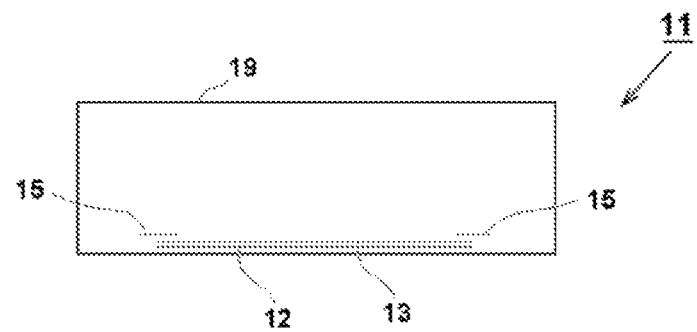
FIG. 2B is a front transparent view.
Figure 2C:
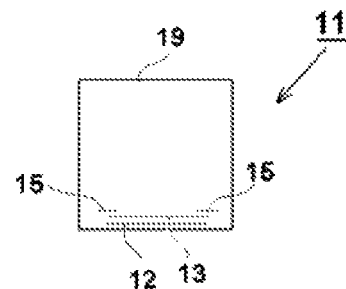
FIG. 2C is a side transparent view.

The power supply tap 11 as shown in FIGS. 2A, 2B and 2C is schematically drawn enlarging spaces between each material for the sake of explanation, but materials are actually in close contact with each other. In the Second Embodiment, the hygroscopic fiber 12 same to that of the First Embodiment, which is cut smaller than a size of a bottom inside the housing 19, is adhered onto the bottom inside the housing 19 of the existing power supply tap 11, and four corners of the hygroscopic fiber 12 are affixed to the bottom inside the housing 19 of the power supply tap 11 with an aluminum tape as a tape 15 for fixing. In the Second Embodiment, the hygroscopic fiber 12 is positioned on the bottom inside the housing 19 of the power supply tap 11 as an example, but the hygroscopic fiber 12 may be adhered to any position outside or inside with the tape 15 as long as it is conducted to the housing 19 of the power supply tap 11. Even if the hygroscopic fiber 12 is used partially by making it smaller than the surface area of the power supply tap 11, the effect is only reduced in some degree but sufficiently practical.

Here, in order to further improve the performance in the Second Embodiment, a conductive fiber 13 may be superimposed on the hygroscopic fiber 12. Even if the conductive fiber 13 is also used partially by making it smaller than the surface area of the power supply tap 11, the effect is sufficiently increased. Since the housing 19 of the power supply tap 11 is made of aluminum die-cast and has conductivity, the conductive fiber 13 is not only superimposed on the hygroscopic fiber 12 but may be adhered on any position outside or inside the housing 19 of the power supply tap 11 with the tape 15. Here, an aluminum tape as the tape 15 is an example, but any tape may be used as long as it is capable of adhering. For example, a copper tape may be used to enhance conductivity. An aluminum tape is suitable for countermeasures against a high frequency system such as a video, digital signals or the like, a copper tape or a gold tape is suitable for low frequency signals in audio range. A silver tape is suitable for all-round countermeasures in any range. Corresponding to a size of the hygroscopic fiber 12, a size of the tape 15 is made smaller. The tape 15 is enough to cover only ranges of four corners at minimum, since it is just for fixing.

The Second Embodiment is a simple embodiment that may be carried out by an amateur himself, but in case of a manufacturer of the power supply tap 11, it is also possible to be realized by sandwiching the hygroscopic fiber 12 and the conductive fiber 13 within a plate of the aluminum housing 19 of the power supply tap 11 from above and below to make a layered plate screwed at four corners.

Third Embodiment

Figure 3A:
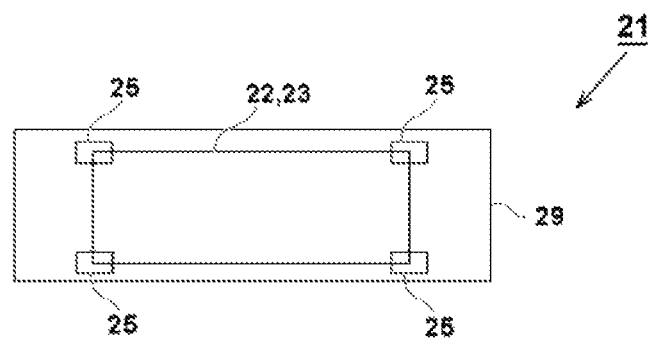
FIG. 3A is a top view.
Figure 3B:
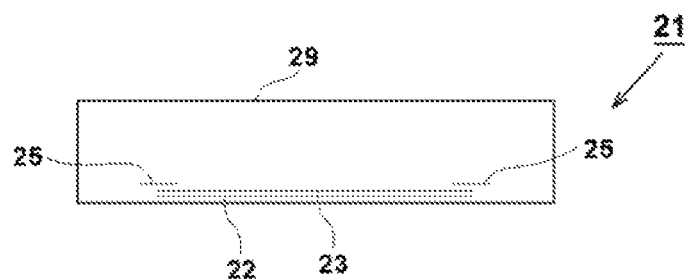
FIG. 3B is a front transparent view.
Figure 3C:
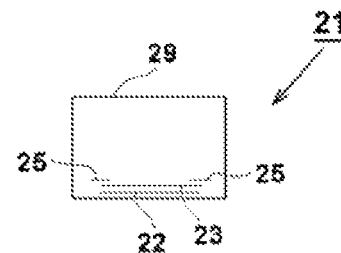
FIG. 3C is a side transparent view.

FIG. 3 shows an embodiment in which the present invention is applied to a battery 21. FIG. 3A is a top view, FIG. 3B is a front transparent view, and FIG. 3C is a side transparent view. FIG. 3 is schematically drawn enlarging spaces between each material for the sake of explanation, but materials are actually in close contact with each other. A hygroscopic fiber 22 same to the hygroscopic fiber 2 of the First Embodiment, which is cut smaller, is adhered onto a bottom inside a housing 29 of the battery 21, and four corners of the hygroscopic fiber 22 are affixed to the bottom inside the housing 29 of the battery 21 with an aluminum tape as a tape 25 for fixing. A size of the hygroscopic fiber 22 is made smaller than a size of the bottom inside the housing 29 of the battery 21. Here, an aluminum tape as the tape 25 is an example, but any tape may be used as long as it is capable of adhering. For example, a copper tape may be used to enhance conductivity. An aluminum tape is suitable for countermeasures against a high frequency system such as a video, digital signals or the like, a copper tape or a gold tape is suitable for low frequency signals in audio range. A silver tape is suitable for all-round countermeasures in any range.

In the Third Embodiment, the hygroscopic fiber 22 is positioned on the bottom inside the housing 29 of the battery 21 as an example, but the hygroscopic fiber 22 may be adhered to any position outside or inside with the tape 25 as long as it is conducted to the housing 29 of the battery 21. Even if the hygroscopic fiber 22 is made partial namely smaller than the surface area of the battery 21, the effect is only reduced in some degree but sufficiently practical. Concrete examples of the hygroscopic fiber 22, a method of carrying conductivity on the hygroscopic fiber, a method of influencing an inorganic ion exchanger, and a method of performing porous treatment in a supercritical manner are exactly same to those in the First Embodiment. Here, in order to further improve the performance in the Third Embodiment, a conductive fiber 23 may be superimposed on the hygroscopic fiber 22. Even if the conductive fiber 23 is also used partially by making it smaller than the surface area of the battery 21, the effect is sufficiently increased. Since the housing 29 of the battery 21 is made of metal and has conductivity, the conductive fiber 23 is not only superimposed on the hygroscopic fiber 22 but may be adhered on any position outside or inside the housing 29 of the battery 21 with the tape 25. Corresponding to a size of the hygroscopic fiber 22, a size of the tape 25 is made smaller. The tape 25 is enough to cover only ranges of four corners at minimum, since it is just for fixing. The Third Embodiment is a simple embodiment that may be carried out by an amateur himself, but in case of a manufacturer of the battery 21, it is also possible to be realized by sandwiching the hygroscopic fiber 22 and the conductive fiber 23 within a plate of the metal housing of the battery 21 from above and below to make a layered plate screwed at four corners.

Fourth Embodiment

Figure 4A:
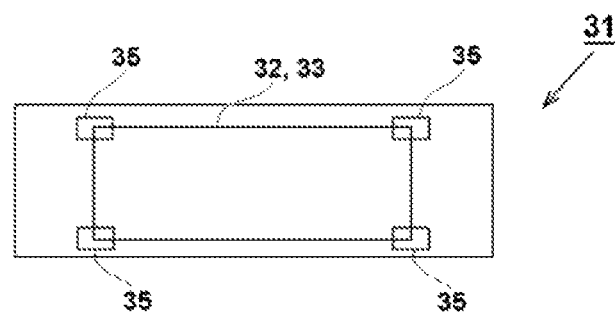
FIG. 4A is a top view.
Figure 4B:
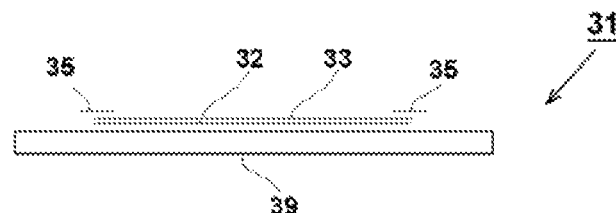
FIG. 4B is a front transparent view.
Figure 4C:
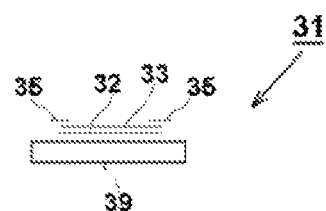
FIG. 4C is a side transparent view.

FIGS. 4A, 4B and 4C show an embodiment in which the present invention is applied to a printed circuit board 31. FIG. 4 is schematically drawn enlarging spaces between each material for the sake of explanation, but materials are actually in close contact with each other. In order to simplify the explanation, the Fourth Embodiment is directed to an embodiment of the printed circuit board 31 in two-layer, for example, where an upper side in FIG. 4 is a ground plane exclusive surface. The Fourth Embodiment may be also implemented in the same manner even in multi-layer. In FIG. 4, a hygroscopic fiber 32 same to that of the First Embodiment, which is cut smaller than a size of the ground plane exclusive surface of a substrate 39, is adhered onto the ground plane exclusive surface of the existing printed circuit board 31, and four corners of the hygroscopic fiber 32 are affixed to the ground plane exclusive surface of the printed circuit board 31 with an aluminum tape as a tape 35 for fixing. Here, an aluminum tape as the tape 35 is an example, but any tape may be used as long as it is capable of adhering. For example, a copper tape may be used to enhance conductivity. An aluminum tape is suitable for countermeasures against a high frequency system such as a video, digital signals or the like, a copper tape or a gold tape is suitable for low frequency signals in audio range. A silver tape is suitable for all-round countermeasures in any range. In the Fourth Embodiment, the hygroscopic fiber 32 is positioned on the ground plane exclusive surface of the substrate 39 as an example, but the hygroscopic fiber 32 may be adhered to any position outside or inside with the tape 35 as long as it is conducted to the housing of the ground plane exclusive surface of the substrate 39.

Even if the hygroscopic fiber 32 is used partially by making it smaller than the surface area of the ground plane exclusive surface of the substrate 39, the effect is only reduced in some degree but sufficiently practical. Concrete examples of the hygroscopic fiber 32, a method of carrying conductivity on the hygroscopic fiber, a method of influencing an inorganic ion exchanger, and a method of performing porous treatment in a supercritical manner are exactly same to those in the First Embodiment. Here, in order to further improve the performance in the Fourth Embodiment, a conductive fiber 33 may be superimposed on the hygroscopic fiber 32. Even if the conductive fiber 33 is also used partially by making it smaller than the surface area of the ground plane exclusive surface of the printed circuit board 31, the effect is sufficiently increased. Further, since the ground plane exclusive surface of the printed circuit board 31 has conductivity, the conductive fiber 33 is not only superimposed on the hygroscopic fiber 32 but may be adhered on any position on the ground plane exclusive surface of the printed circuit board 31 with the tape 35. Corresponding to a size of the hygroscopic fiber 32, a size of the tape 35 is made smaller. The tape 35 is enough to cover only ranges of four corners at minimum, since it is just for fixing. The Fourth Embodiment is a simple embodiment that may be carried out by an amateur himself, but in case of a manufacturer of the printed circuit board, it is also possible to be realized by sandwiching the hygroscopic fiber 32 and the conductive fiber 33 within a ground plane layer of the printed circuit board to make a printed circuit board in multilayer structure in which a layer is further added.

Fifth Embodiment

Figure 5A:
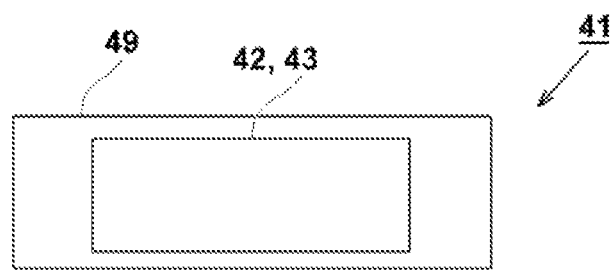
FIG. 5A is a top view.
Figure 5B:
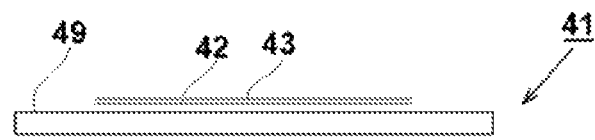
FIG. 5B is a front transparent view.
Figure 5C:
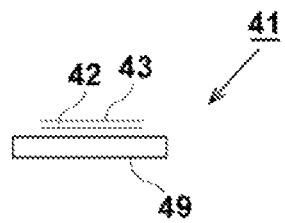
FIG. 5C is a side transparent view.

A Fifth Embodiment is an embodiment in which the present invention is applied to an LSI (Large Scale Integrated Circuit) 41. Although the LSI 41 is here described as an example of electric components, the Fifth Embodiment is not limited to the LSI, and it is possible to replace it with all other electric components such as an IC that may be mounted on a printed circuit board. In the Fifth Embodiment, in order to simplify the explanation, the LSI having a housing 49 in a rectangular parallelepiped shape is described as a representative. FIG. 5 is schematically drawn enlarging spaces between each material for the sake of explanation, but materials are actually in close contact with each other.

In FIG. 5, a hygroscopic fiber 42 same to that in the First Embodiment is adhered to a ceiling of the housing 49 with an adhesive. The hygroscopic fiber 42 is cut to a size smaller than the ceiling surface of the housing 49. Even if the hygroscopic fiber 42 is made partial namely smaller than the surface area of the housing 49, the effect is only reduced in some degree but sufficiently practical. Concrete examples of the hygroscopic fiber 42, a method of carrying conductivity on the hygroscopic fiber, a method of influencing an inorganic ion exchanger, and a method of performing porous treatment in a supercritical manner are exactly same to those in the First Embodiment.

In order to further improve the performance in the Fifth Embodiment, a conductive fiber 43 may be superimposed on the hygroscopic fiber 42 and adhered with an adhesive. Even if the conductive fiber 43 is also used partially by making it smaller than the surface area of the housing 49, the effect is sufficiently increased. Therefore, the hygroscopic fiber 42 and the conductive fiber 43 may be made further smaller in each surface area to be adhered. In addition, in case where a shape of the electric component is not rectangular parallelepiped, there is only difference that the hygroscopic fiber 42 and the conductive fiber 43 are cut and adhered according to a shape of the electric component.

The Fifth Embodiment is a simple embodiment that may be carried out by an amateur himself, but in case of a manufacturer of electric components, it is also possible to be realized by sandwiching the hygroscopic fiber 42 and the conductive fiber 43 within a plate of the housing 49 to make a unified plate in multilayer structure.

Sixth Embodiment

A Sixth Embodiment is an embodiment in which the present invention is applied to an electric device assembly 51. A shield of a housing 59 of the electric device assembly 51 in general is a so-called frame ground in which realizes shield by connecting a ground line to the housing 59. In the present invention, a means of adhering the same one to the hygroscopic fiber 2 exemplified in the First Embodiment to the housing 59 of the electric device assembly 51 is provided for the new quantum effect completely different from the shielding effect. Concrete examples of the hygroscopic fiber, a method of carrying conductivity on the hygroscopic fiber, a method of influencing an inorganic ion exchanger, and a method of performing porous treatment in a supercritical manner are exactly same to those in the First Embodiment. A means of adhering the conductive fiber is also provided.

Figure 6:
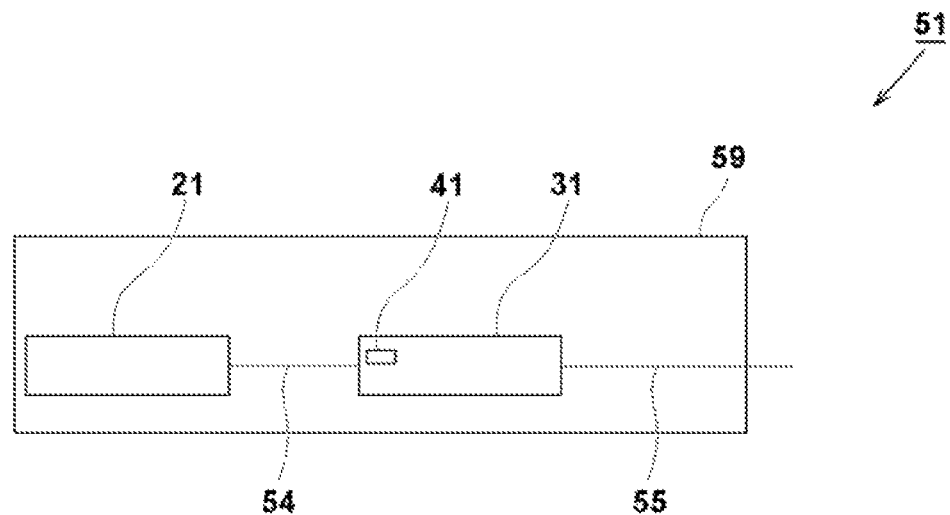
FIG. 6 shows a system diagram of another electric device according to a Sixth Embodiment of the present invention.

In the Sixth Embodiment, while there is a difference that a size of the housing is merely enlarged according to an electric device such as a printed circuit board to be installed therein, a means of adhering the hygroscopic fiber to the housing is exactly same to that of the Second Embodiment. So, the explanation on adhering to the housing is omitted, but FIG. 6 shows a system diagram of the Sixth Embodiment applied to the cable body 1 of the First Embodiment and the LSI 41. In the system diagram, the battery 21, the printed circuit board 31, the LSI 41, an internal wiring cable 54, and an external connecting cable 55 made of the cable body 1 of the First Embodiment are used in the housing 49.

DC power sourced from the battery 21 is supplied to the printed circuit board 31 via the internal wiring cable 54. The LSI 41 attached inside the printed circuit board 31 is drawn in one for convenience of explanation as a representative of electric components mounted inside the printed circuit board 31. Signals processed by these electrical components are output from the external connecting cable 55.

Seventh Embodiment

A Seventh Embodiment is applied to a high-performance cable body 61, which includes a plurality of power supply taps and is connected in series including the cable body 1 of the First Embodiment. The high-performance cable body 61 may be easily realized just by connecting one or more cable body 1 in series among a plurality of cables connected via relays of power supply taps 63, 65, 67. The effect becomes higher as the number of connected cable body 1 is increased two or more. Although the power supply tap 11 of the Second Embodiment is effective at any position, it is more effective to use the power supply tap 11 of the Second Embodiment at a final position where an outlet of the electric device to be supplied is directly connected to. Likewise, the cable body 1 of the First Embodiment is effective at any position, but it is more effective to use the cable body 1 of the First Embodiment to the power supply tap 11 at the final position where the outlet of the electric device to be supplied is directly connected to.

Figure 7:
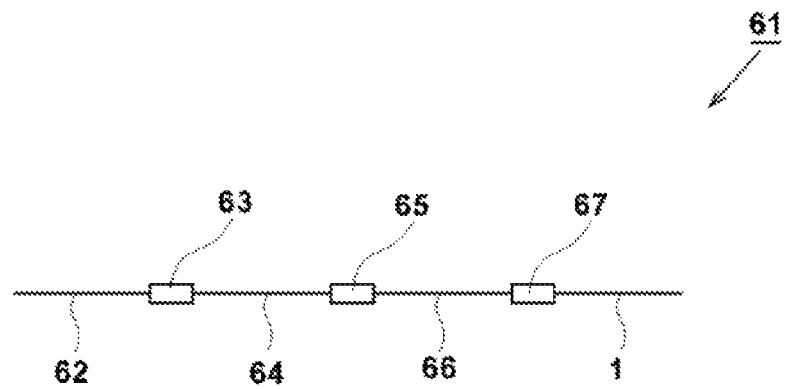
FIG. 7 shows a system diagram of a cable according to a Seventh Embodiment of the present invention.

FIG. 7 shows the high-performance cable body 61 of the Seventh Embodiment. There is a wall outlet (not shown) on the left, electricity flows from the left to the right, and a device (not shown) is connected on the right. Three cables 62, 64, 66 having different frequency properties are connected in series, and finally the cable body 1 of the First Embodiment is connected.

In this embodiment, a conventional cable body 62 strong on low frequency range, a conventional power supply tap 63 strong on low frequency range, a conventional cable body 64 strong on medium frequency range, a conventional power supply tap 65 strong on medium frequency range, a conventional cable body 66 strong on high frequency range, a conventional power supply tap 67 strong on high frequency range, and finally the cable body 1 of the First Embodiment having flat and high energy level over the entire range are connected in this order.

Adding selectively the properties of each cable body and each power supply tap to become flat by trial and error as like this embodiment, it is more advantageous that energy level in quantum state of electrons is further increased over the entire range rather than one of the cable body 1 of the First Embodiment having flat and high energy level over the entire range. Here, as an example of a means of changing frequency properties, it is possible to make some tendencies that aluminum is contained in a metal material of a housing, a shielded wire, a conductive wire or the like resulting in stronger on high frequency range, silver is contained in a metal material of a housing, a shielded wire, a conductive wire or the like resulting in stronger on medium frequency range, and gold or copper is contained in a metal material of a housing, a shielded wire, a conductive wire or the like resulting in stronger on low frequency range.

Eighth Embodiment

An Eighth Embodiment is an embodiment with regard to a method of charging a battery using the cable body 1 of the First Embodiment, a charging cable and the power supply tap of the Second Embodiment. A battery is charged in the state that any other electric device is connected in energizing to a power supply outlet sourced from a switchboard same to a supply source of a cable or a power supply tap used for charging.

Figure 8:
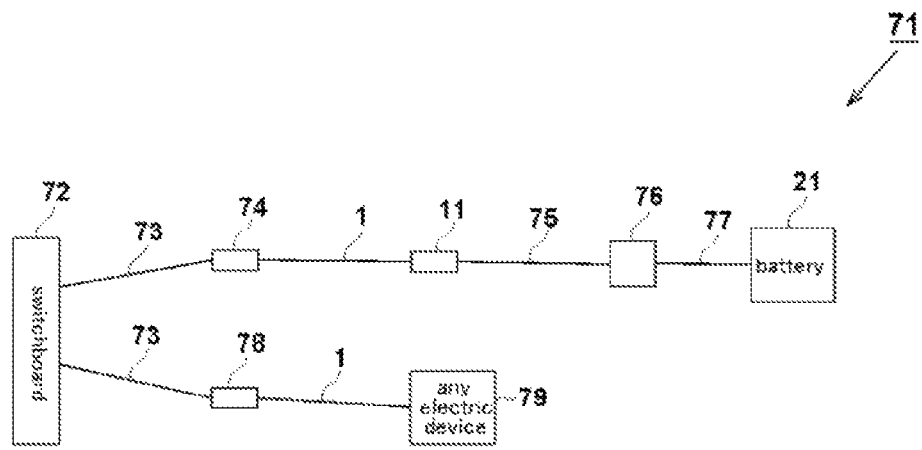
FIG. 8 shows a charging system diagram of a battery mounted electric device according to an Eighth Embodiment of the present invention.

FIG. 8 is a system diagram of a method of charging a battery-mounted electric device in the Third Embodiment of the present invention. In a charging system 71, power is supplied to wall outlets 74, 78 on two routes via indoor wiring cables 73, 73 from the same switchboard 72. Further, power is supplied to the power supply tap 11 from the wall outlet 74 on a first route via the cable body 1 of the First Embodiment. A portable device inner charging circuit 76 is connected to the power supply tap 11 via a power supply cable 75, and the battery 21 is charged from the portable device inner charging circuit 76 via a charging cable 77. As for the charging cable 77, the effect may be sufficiently obtained by using a conventional charging cable of a portable device, but it may have a cable structure exemplified in the First Embodiment when it is desired to further improve its performance. Further, in order to raise energy level in quantum state of charged electrons on the first route, any other electric device 79 is connected in energizing to the wall outlet 78 on the second route via the cable body 1. Since the purpose of connection of the second route is just to increase power consumption, it is necessary only to connect any other electric device 79 in energizing. This is because it has been first found that, though charging itself on the first route consumes originally a small amount of power, energy level in quantum state of electrons on the first route increases by connecting in energizing any other electric device 79 having a large power consumption on the second route. This event occurs only by using the cable body 1 or the power supply tap 11 as a part of a power supply environment, and thus it is a novel event distinctive of the present invention. This event has sufficiently the effect as long as the cable body 1 of the First Embodiment or the power supply tap 11 of the Second Embodiment is used as a part of the first route, even if the cable body 1 or the power supply tap 11 of the Second Embodiment is not used through the second route. It is, however, confirmed that the effect is further improved by using the cable body 1 or the power supply tap 11 of the First or Second Embodiment through the second route as well.

Ninth Embodiment

Figure 9:
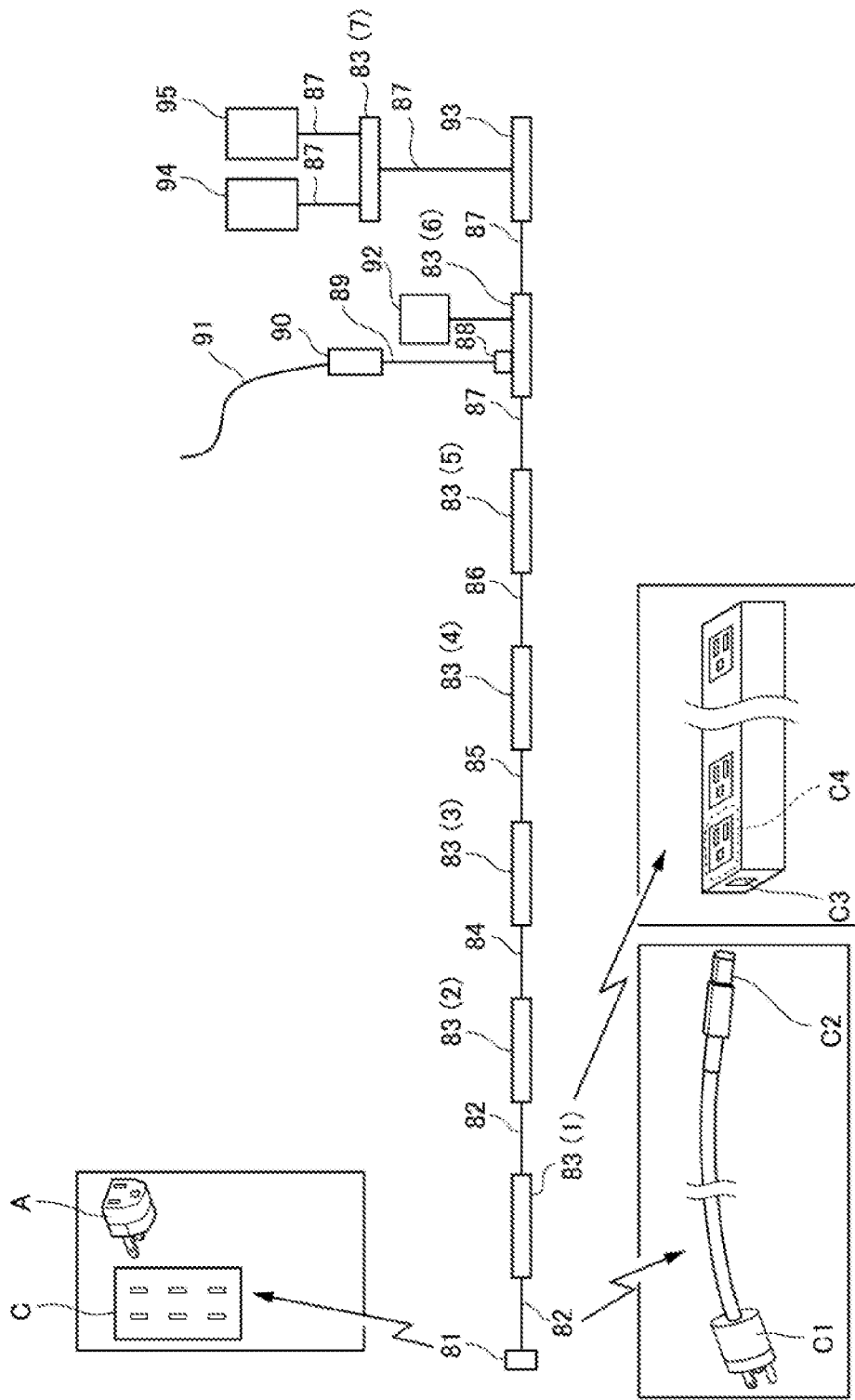
FIG. 9 shows a configuration according to a Ninth Embodiment of the present invention.

A Ninth Embodiment is an embodiment for experimental evaluation of the present invention in a configuration including specific trade names. FIG. 9 is a diagram of illustrating the configuration of the Ninth Embodiment. As shown in FIG. 9, a power supply cable 82 (also simply referred to as a cable) strong on ultra-low frequency range (for example, an ultra-low sound range of 20 to 50 Hz) is first connected to a usual wall outlet 81 provided on a wall of a house.

For example, "Purist Audio Design (hereinafter referred to as PAD)/Dominus AC Rev.B Power Cable", which is a power supply cable made by Purist Audio Design, Inc., may be cited as a representative of the power supply cable 82 strong on ultra-low frequency range. The term of "strong on ultra-low frequency range" is an expression usually used in the audio field, meaning that, for example, an ultra-low sound range of 20 to 50 Hz is strongly felt when a person listens. There are not only signal cables but also power supply cables matching each sound range in the audio field, and PAD/Dominus AC Rev.B Power Cable which is a power supply cable made by Purist Audio Design, Inc. is well known as one strong on ultra-low frequency range. This matter is also applied to the following description.

Since the power supply cable 82 is provided with a three-pronged connector C1 as shown in FIG. 9 on a side to be connected to the wall outlet 81 (see "C" in FIG. 9), it is connected to the wall outlet 81 via a double-pole to triple-pole conversion connector A.

Then, a power supply tap 83(1) is connected to the power supply cable 82 on a side opposite to the side to be connected to the wall outlet 81. For example, "Belden/Power Tap PS1850" which is a power supply tap made by Belden, Inc. may be cited as a representative of the power supply tap 83(1). An input side (see "C3" in FIG. 9) of the power supply tap 83(1) is formed corresponding to a connector C2 of the power supply cable 82 which is not the three-pronged connector Cl, and the power supply cable 82 is connected directly thereto.

Further, a second power supply cable 82 strong on ultra-low frequency range is connected to an output side of the power supply tap 83(1). As shown in FIG. 9, since an insertion port C4 on the output side of the power supply tap 83(1) is formed corresponding to the three-pronged connector C1, the second power supply cable 82 is directly connected to the power supply tap 83(1) with no need of the double-pole to triple-pole conversion connector A as described above.

Subsequently, behind the second power supply cable 82, a power supply tap 83(2) is connected in the same manner as before. It is noted that the power supply tap 83(1) and the power supply tap 83(2) are the same type of power supply tap, and the description of "(1)" and "(2)" added rearward indicates positions of the power supply taps 83 counting from "(1)" nearest to the wall outlet 81. A power supply tap 83(3) to a power supply tap 83(7) coming out later are described in the same manner.

Next, a power supply cable 84 (also simply referred to as a cable) strong on medium-low frequency range (for example, a medium-low sound range of 100 to 300 Hz) is connected to an output side of the power supply tap 83(2). For example, "NBS Audio Cables (hereinafter referred to as NBS)/Statement II Power Cable 1.5 m" which is a power supply cable made by NBS, Inc. may be cited as a representative of the power supply cable 84 strong on medium-low frequency range. The power supply cable 84, as like the power supply cable 82, has a three-pronged connector on one side so that it is directly connected to an outlet on the output side of the power supply tap 83(2).

Then, a power supply tap 83(3) is connected behind the power supply cable 84. Since a connector of the power supply cable 84 which is not the three-pronged connector is formed corresponding to an input side of the power supply tap 83(3), it is directly connected to the power supply tap 83(3).

Further, a power supply cable 85 (also simply referred to as a cable) strong on medium-high frequency range (for example, a medium-high sound range of 2000 to 5000 Hz) is connected to an output side of the power supply tap 83(3), and a power supply tap 83(4) is connected behind the power supply cable 85. For example, "NBS/Black Label A/C Power Cable 1.8 m" which is a power supply cable made by NBS, Inc. may be cited as a representative of the power supply cable 85 strong on medium-high frequency range, and the power supply cable 85 is also provided with connectors similar to the above cables, so that it is directly connected to the power supply tap 83(3) and the power supply tap 83(4).

Further, a power supply cable 86 (also simply referred to as a cable) widely strong on from 300 to 20000 Hz, namely medium frequency range (for example, a medium sound range of 300 to 2000 Hz) to ultra-high frequency range (for example, a ultra-high sound range of 10000 to 20000 Hz), is connected to an output side of the power supply tap 83(4), and a power supply tap 83(5) is connected behind the power supply cable 86. For example, "Synergistic Research/Designers' Reference Squared AC Master Coupler Power Cable 1.8 m" made by Synergistic Research, Inc. may be cited as a representative of the power supply cable 86 widely strong on medium frequency range to ultra-high frequency range, and the power supply cable 86 is also provided with connectors similar to the above cables, so that it is directly connected to the power supply tap 83(4) and the power supply tap 83(5).

Then, a power supply cable 87 improved as described in the First Embodiment is connected to the power supply tap 83(5), and a power supply tap 83(6) is connected behind the power supply cable 87.

Here, an example of the power supply cable 87 improved as described in the First Embodiment is specifically described below. For example, "Yanagida Audio Cable/Master2 Power Cable" which is a power supply cable made by Yanagida Audio Cable, Inc. is prepared as an original power supply cable (hereinafter also referred to as an original power supply cable or an original cable).

The power supply cable 87 or the power supply cable made by Yanagida Audio Cable, Inc. as the original power supply cable is also provided with connectors similar to the above cables, so that it is directly connected to the power supply tap 83(6).

Next, a sheet of MOISFINE (a registered trademark), which is laid under a futon (Japanese-style mattress) and made by Toyobo Co., Ltd., is prepared as a representative example corresponding to the hygroscopic fiber 2 (a first material) of the First Embodiment to be wound around an outer circumference of the original power supply cable. The sheet is cut in accordance with a size of the original power supply cable, and a silver ion nano-colloidal solution of NANOPURE M-02 (a trade name) made by Japan Ion Corporation is sprayed directly on all over two sides of MOISFINE to improve performance.

Furthermore, a tungsten oxide-containing solution of RENECAT (a registered trademark) made by Toshiba Corporation is sprayed directly on all over two sides of MOISFINE, and then MOISFINE impregnated sequentially in this manner with a silver ion nano-colloidal solution and a tungsten oxide-containing solution is wound around an outer circumference of the original power supply cable.

Next, THUNDERON (a registered trademark) made by Nihon Sanmo Dyeing Co., Ltd. as a representative example corresponding to the conductive fiber 3 of the First Embodiment to be wound on the hygroscopic fiber 2 is cut in accordance with the size of the original power supply cable, and a silver ion nano-colloidal solution of NANOPURE M-02 (a trade name) made by Japan Ion Corporation is sprayed directly on all over two sides of THUNDERON to improve performance.

Furthermore, a tungsten oxide-containing solution of RENECAT (a registered trademark) made by Toshiba Corporation is sprayed directly on all over two sides of THUNDERON (a registered trademark), and then THUNDERON impregnated sequentially in this manner with a silver ion nano-colloidal solution and a tungsten oxide containing solution is wound around an outer circumference of MOISFINE having been wound around the outer circumference of the original power supply cable.

Finally, an aluminum tape as a representative example of the sheath 4 of the First Embodiment is carefully wound in spiral over the entire outermost circumference to cover a part of each connector at both ends of the original power supply cable corresponding to the connectors 8 at both ends of the cable of the First Embodiment resulting in tubular shape, thereby MOISFINE (a registered trademark) and THUNDERON (a registered trademark) are fixed to the entire cable with this aluminum tape.

The power supply tap 83(6) as described above is connected behind the power supply cable 87 which is improved from the original power supply cable in this manner.

Further, another power supply cable 87 same as described above is connected to an output side of the power supply tap 83(6), and a power supply filter 93 is connected to the power supply cable 87. For example, "Asuka/Power Supply Filter FIL-MASTER-PRO II" made by Asuka, Inc. may be cited as a representative of the power supply filter 93.

Then, another power source cable 87 same as described above is further connected to the power supply filter 93, and a power supply tap 83(7) is connected behind this power source cable 87 in the same manner as before, and a high-end audio device 94 with powerful power source is connected to the power supply tap 83(7). Specifically, "Esoteric/CD Transport P-0" made by Teac Corporation may be cited as a representative of the high-end audio device 94 with powerful power source.

Furthermore, a high-end audio device 95 with ultra-high precision clock is connected to an outlet of the power supply tap 83(7), which is different from the output connected to the high-end audio device 94, so that the high-end audio device 94 and the high-end audio device 95 are connected in parallel with regard to the power supply tap 83(7). For example, "Cybershaft/Ultra-High Precision OCXO 10 MHz Clock Premium" made by Cyber Shaft Corporation may be cited as a representative of the high-end audio device 95 with ultra-high precision clock. Incidentally, the high-end audio device 94 and the high-end audio device 95 are turned on during charging as described later.

All of the power supply filter 93, the high-end audio device 94 with powerful power source and the high-end audio device 95 with ultra-high precision clock include a low ESR (Equivalent DC Resistance) capacitor distinctive of a high-end audio device as feature, so that it is aimed to improve the effect of the present invention by accumulating electrons reformed by the present invention in the capacitors connected in parallel to the power supply. In particular, the power supply filter 93 includes an ultra-low ESR (Equivalent DC Resistance) capacitor to smooth noise of the entire power supply as well, thereby improving the effect.

Under the above described configuration, charging of the present invention is performed to Electrically Assisted Pedal Cycle and the audio player 90 as described above. Specifically, a charger 92 belonging to Electrically Assisted Pedal Cycle is connected to the output side of the power supply tap 83(6) sixth from the left in FIG. 9 to supply electric power and charge a battery belonging to Electrically Assisted Pedal Cycle according to the present invention.

It is noted that, in the conventional charging described above, the charger 92 belonging to Electrically Assisted Pedal Cycle is directly connected to the wall outlet 81 of FIG. 9 without passing through the power supply cable 87 to supply electric power and charge the battery belonging to Electrically Assisted Pedal Cycle.

Likewise, an AC outlet 88 belonging to Apple/iPOD Shuffle ME949J/A is connected to the power supply tap 83(6) sixth from the left in FIG. 9, a charging cable 89 belonging to the Apple/iPOD Shuffle ME949J/A is connected to the AC outlet 88, and the audio player 90 (Apple/iPOD Shuffle ME949J/A) is connected to the charging cable 89 to supply electric power and charge according to the present invention. In addition, charging is to be fully charged.

On the other hand, in the conventional charging, the AC outlet 88 belonging to Apple/iPOD Shuffle ME949J/A is connected to the wall outlet 81 of FIG. 9, the charging cable 89 belonging to Apple/iPOD Shuffle ME949J/A is connected to the AC outlet 88, and the audio player 90 (Apple/iPOD Shuffle ME949J/A) is connected to the charging cable 89 to charge the battery. In addition, this charging is also to be fully charged.

In addition, at the time of trial listening, an earphone 91 of OHM Electric/Canal Inner-Phone Blue HP-B140K-A91 is connected to the audio player 90 for trial listening.

As described in detail below, the results that a longer running distance of Electrically Assisted Pedal Cycle and a better sound quality are achieved according to charging of the present invention as compared with the conventional charging.

Examples of Secondary Effects

Since it would be difficult to understand with only the quantum-physical function, examples which have high secondary effects further caused by the basic effect are described below. It is noted that these are merely examples of secondary effects, and the present invention has enormous value and usefulness that there is a possibility of widely and generically exhibiting the basic effect in all electric devices.

The present invention is effective in an electric device of a mechanical motor drive system requiring torque. Especially when applied to things like EV (Electric Vehicle), flat and powerful torque properties over the whole revolution number are achieved to obtain an effect of improving the driving force of the EV with good acceleration. When acceleration is improved, there is no need to step on an accelerator much, so another secondary effect that improves electric power consumption is also born.

The above secondary effect was tested by the difference between a conventional charging method and a charging method according to the present invention in an actual measurement experiment on running distance per charge of Electrically Assisted Pedal Cycle as below. A running pattern in automatic mode employed a de facto standard pattern, in which a running pattern including (1) 1 km at 15 km/h with 3rd gear on flat ground, (2) 1 km at 10 km/h with 2nd gear on 4° uphill slope, (3) 1 km at 15 km/h with 3rd gear on flat ground, and (4) 1 km at 20 km/h with 3rd gear on 4° downhill slope is repeated continuously. The results were as follows.

Actual measurement of running distance of Electrically Assisted Pedal Cycle using a battery before application of the present invention: 36.18 km Actual measurement of running distance of Electrically Assisted Pedal Cycle using a battery after application of the present invention: 95.47 km An improvement rate of about 2.6 times as above showed a performance in technology level which may be said amazing, compared to an improvement rate of about 1.5 times in EV's battery technology as of the end of the year 2015 even when parts of a battery were entirely reformed to high quality parts. Besides EV system, there is a secondary effect of increasing a battery capacity in addition to raising energy.

Further, the following experiment was conducted as another experiment. In a commercially available and rechargeable nickel-metal hydride battery in AA-size, illuminance and duration of a LED flashlight were measured using a conventional charging method and a charging method according to the present invention. The results were as follows.

Illuminance and duration before application of the present invention: 19,500 lux and 1007 minutes Illuminance and duration after application of the present invention: 29,500 lux and 1571 minutes.

Two effects of extending duration while increasing illuminance were realized, and energy became about 2.4 times in total, thus the achievement consistent with the experiment of the Electrically Assisted Pedal Cycle was obtained. Thereby, the effect of increasing a battery capacity after application of the present invention as compared to before application of the present invention was proved. However, although there was a possibility that errors were included as for illuminance since it was measured only when started, duration became about 1.57 times even granted illuminance was the same between before and after application of the present invention.

Examples of Ninth Embodiment

Further, an experiment using a Ninth Embodiment described later with reference to FIG. 9 as an embodiment for experimental evaluation of the present invention was carried out. This experiment was carried out in order to obtain a more accurate experimental result as described later, taking into consideration that measurement errors etc. were possibly large in the previous experiment. The experiment was conducted using BRIDGESTONE Electrically Assisted Pedal Cycle BKO 85 as an experimental bicycle under an experimental condition of a running pattern in continuous running by pedaling at 15 km/h with 3rd gear on flat ground. A new battery before application of the present invention was charged by connecting a charger 92 (see FIG. 9) belonging to BRIDGESTONE Electrically Assisted Pedal Cycle BKO 85, to a usual wall outlet 82 provided on a wall of a house. The battery was charged in that manner and attached to the experimental bicycle (BRIDGESTONE Electrically Assisted Pedal Cycle BKO 85) to actually measure running distance becoming from FL (100%) to 0% with a display meter belonging to the bicycle (hereinafter, a battery charged with this normal charging is also referred to as a battery before application of the present invention, and this charging is also referred to as a conventional charging).

After that experiment, a charging of the present invention was performed to the same battery with the charger 92 belonging to Electrically Assisted Pedal Cycle in the configuration of the experimental evaluation of the Ninth Embodiment (see FIG. 9). The battery was charged in that manner and attached to the experimental bicycle (BRIDGESTONE Electrically Assisted Pedal Cycle BKO 85) to actually measure running distance becoming from FL (100%) to 0% with the display meter belonging to the bicycle.

Although it is specifically described in the Ninth Embodiment referring FIG. 9 later, the charger 92 belonging to BRIDGESTONE Electrically Assisted Pedal Cycle BKO 85 was not directly connected to the usual wall outlet 82 (see FIG. 9) but was connected as shown in FIG. 9 to charge the battery (hereinafter, a battery charged according to the present invention is also referred to as a battery after application of the present invention, and this charging is also referred to as a charging of the present invention).

In the experiment using the Ninth Embodiment, a method of testing sustainability in constant assist at 15 km/h with 3rd gear on flat ground was selected because it is possible to precisely measure comparison between before processing (or, a battery before application of the present invention) and after processing (or, a battery after application of the present invention). In other words, if the test would be conducted under complicated multi-running loads in which inclinations and speeds change variously, loads on the battery become larger or smaller. So, the probability of becoming 0% is concentrated in a place where the load is larger, resulting in not obtaining an accurate ratio of running distance before and after the present invention. In order to avoid this problem, the experiment was conducted with emphasis on precision by unifying a continuous running test in which a constant load was perfectly maintained. To put it more clearly, under complicated multi load conditions, it is difficult to make accurate comparative measurements because large errors are easily born due to acceleration in switching a load.

Actual measurement results of running distance of Electrically Assisted Pedal Cycle using a battery before application of the present invention and a battery after application of the present invention were as follows.

Actual measurement of running distance of Electrically Assisted Pedal Cycle using a battery before application of the present invention: 79.52 km Actual measurement of running distance of Electrically Assisted Pedal Cycle using a battery after application of the present invention: 124.23 km As may be seen in the results, the running distance of Electrically Assisted Pedal Cycle in use of the battery after application of the present invention was improved to about 156% longer as compared with in use of the battery before application of the present invention which was normally charged. This comparison, as described above, provides accurate quantitative measurement in continuous running with a precise constant load, so it may be said that the degree of the effect of the present invention is shown accurately.

In addition, the following experiment was also conducted as another experiment using the Ninth Embodiment. Specifically, an audio player 90 (Apple/iPOD Shuffle ME949J/A) was charged both in a manner of performing an extremely general charging (hereinafter also referred to as a conventional charging) and in a manner of performing the charging of the present invention (hereinafter also referred to as the charging of the present invention) as well as Electrically Assisted Pedal Cycle as described above, and a blind sound quality experiment was conducted to confirm changes in sound quality between both manners.

In the blind sound quality experiment, including both the conventional charging and the charging of the present invention, a trial listening of music was performed using an earphone of OHM/Canal Inner Phone Blue HP-B 140K-A made by OHM Electric Inc. as an earphone 91, the second song of Perfume/LEVEL3 was used as the trial listening source to let five listeners listened. The trial listening was conducted five times for each listener as one pair of before and after inventive processing (or, the conventional charging and the charging of the present invention).

Upon charging, two audio players 90 (Apple/iPOD Shuffle ME949J/A) were prepared, and the trial listening source was input into each audio player 90. With regard to one audio player 90, an AC outlet 88 belonging to Apple/iPOD Shuffle ME949J/A was connected directly to the ordinary wall outlet 82 (see FIG. 9) provided on a wall of a house, and a charging cable 89 belonging to Apple/iPOD Shuffle ME949J/A was connected to the AC outlet 88, and one audio player 90 was connected to the charging cable 89 to be charged (with the conventional charging).

With regard to the other audio player 90 (Apple/iPOD Shuffle ME949J/A), the AC outlet 88 of Apple/iPOD Shuffle ME949J/A was connected to a power supply tap 83(6) sixth from the left of FIG. 9 as described later in the Ninth Embodiment, and the charger cable 89 of Apple/iPOD Shuffle ME949J/A was connected to the AC outlet 88, and the other audio player 90 was connected to the charging cable 89 to be charged (with the charging of the present invention).

It is noted that a cellophane tape was affixed to the other audio player 90 charged by the charging of the present invention to be distinguished from one audio player 90 charged by the conventional charging.

Then, the trial listening of music reproduced by the audio players 90 was made to the listeners who got blindfolded. Here, an experiment provider decided whether to reproduce music first or later in either one audio player 90 charged by the conventional charging or the other audio player 90 charged by the charging of the present invention, and further, to make the order thereof at random.

For this reason, the listeners themselves were in a situation of not knowing which audio player 90 was reproducing music, and in such situation, one having better sound quality was selected by the listeners. It was noted that sound volume was set exactly same between when reproducing music by one audio player 90 charged by the conventional charging and when reproducing music by the other audio player 90 charged by the charging of the present invention.

As results of five listeners, each listener answered that, in all pairs of five trial listening, the device (the audio player 90) after application of the present invention (or, the charging of the present invention) was better in sound quality. Therefore, it was concluded that the superiority of sound quality after application of the present invention (or, the charging of the present invention) was significantly obtained since the results were in harmony at the probability of $1/(2^{25})$.

Upon confirming power consumption and current value in charging with a clamp meter in a power source of a charger, namely the state of charge to the battery, no difference in power consumption and current value was generated at all between the charging before application of the present invention and the charging after application of the present invention. This means that the present invention as charging specifications is guaranteed not to deviate from manufacturer's standard specifications in power and current at all. It may be said that this is an improvement of not quantity but quality of electric power and thus the present invention is to contribute to ecology of electric power. Consequently, it may be judged that energy efficiency is raised.

Examples given here are merely examples. In these examples, a basic function of raising quantum state of electrons is applied by charging a battery of an electric device via a cable, a power supply tap, a battery, a printed circuit board, a LSI/IC component or any other electric component that employs, as an envelope, a hygroscopic fiber, a hygroscopic resin, an inorganic ion exchanger influence fiber, an inorganic ion exchanger influence resin, a supercritical influence fiber, a supercritical influence resin or a resin/fiber obtained by mixing the above three types of fibers/resins. So, the energy efficiency becomes electrically higher than a conventional performance and thus a battery with high output energy may be obtained even under the same setting as a result. As described above, the present invention may obtain a secondary effect that physical energy output after electric conversion such as light, sound, magnetism, radio wave, heat, ion, mechanical rotation or the like is raised under the same setting in all electric devices in general.

Although the present invention has been described based on specific embodiments as above, the present invention is not limited to the above specific embodiments.

Figure 10:
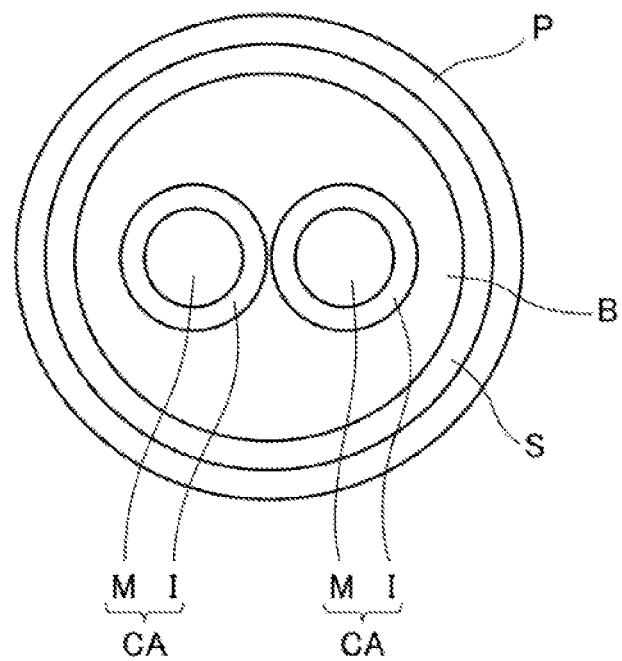
FIG. 10 shows an example of a power supply cable that may be used for an original power supply cable of the present invention.

For example, in the Ninth Embodiment, the power supply cable (Yanagida Audio Cable/Master2 Power Cable) made by Yanagida Audio Cable, Inc. is used as the original power supply cable, but the original power supply cable need not be limited to this, for example, a power supply cable as generally shown by way of example in FIG. 10 may be used.

That is, as the original power supply cable, any cable is available if it includes a pair of electric wires CA, a buffer layer B made of a cushioning material covering the pair of electric wires CA, a shield layer S such as a copper foil covering an outer circumference of the buffer layer B, and the shield layer S and an insulating sheath P of insulating resin such as polyethylene covering shield layer S. A pair of the electric wires CA may be general one, and for example, a wire including a single wire conductor M made of a conductive material such as copper and an insulating layer I of an insulating resin such as polyethylene covering an outer circumference of the single wire conductor M may be cited as the electric wire CA.

An aluminum tape is used as the sheath 4 for fixing in the First Embodiment, and an aluminum tape is used as the power supply cable 87 in the Ninth Embodiment. However, it is not necessary to be limited to an aluminum tape, an aluminum tape may be replaced with a metal tape (metallic sheath) such as magnesium, copper, rhodium, silver or gold.

Further, with regard to the tape 15 for fixing exemplified on the power supply tap 11 in the Second Embodiment, the tape 25 for fixing exemplified on the battery 21 in the Third Embodiment, and the tape 35 for fixing exemplified on the printed circuit board (substrate) in the Fourth Embodiment, a metal tape such as magnesium, copper, rhodium, silver or gold may be used in place of the aluminum tape as above.

In addition, in adhering the hygroscopic fiber 42 to the housing 49 with regard to the electric components of the Fifth Embodiment, and in adhering (affixing) the same one as hygroscopic fiber 2 of the First Embodiment to the housing 59 with regard to the electric device assembly of the Sixth Embodiment, a metal tape having a refractive index of 1 or less such as aluminum, magnesium, copper, rhodium, silver or gold may be used. The metal tape may be thin or a thin film tape.

Furthermore, in the Ninth Embodiment, the power supply cable 82 strong on ultra-low frequency range, the power supply cable 84 strong on medium-low frequency range, the power supply cable 85 strong on medium-high frequency range, and the power supply cable 86 widely strong on medium to ultra-high frequency range are provided on a side of the wall outlet 81 than the power supply cable 87. That is, before the power is supplied to the power supply cable 87, the power supply cable 82 strong on ultra-low frequency range, the power supply cable 84 strong on medium-low frequency range, the power supply cable 85 strong on middle-high frequency range, and the power supply cable 86 widely strong on medium to ultra-high frequency range are interposed.

However, it is not necessary that all of these power supply cables (the power supply cable 82, the power supply cable 84, the power supply cable 85 and the power supply cable 86) are interposed. One or more power supply cable with different frequency properties for complementing comprehensively auditory frequency properties may be just interposed before the power is supplied to the power supply cable 87 so as to raise flatly the auditory energy over the entire audible range.

As described above, the present invention is not limited to the embodiments, and various modifications and improvements are included in the technical scope of the present invention, that is obvious to those skilled in the art in view of the claims.

The invention described in the claims originally attached to the application of an earlier application as the basis of priority is added below. The claim numbers below are as the claims originally attached to the application of the earlier application.

<Claim 1>

A method of reforming electrons, comprising a step of raising energy efficiency of electrons flowing to an electric device via a cable, a power supply tap, a battery, a printed circuit board, an LSI/IC component or any other electric component, which employs, as an envelope, a hygroscopic fiber, a hygroscopic resin, an inorganic ion exchanger influence fiber, an inorganic ion exchanger influence resin, a supercritical influence fiber, a supercritical influence resin or a composite fiber/resin obtained by mixing the above three kinds of fiber/resin.

<Claim 2>

A cable comprising a plurality of cables having different properties and connected in series, wherein the plurality of cables includes at least one or more cable according to claim 1 or at least one or more power supply tap according to claim 1.

<Claim 3>

An electric device comprising, as a component, the cable according to claim 1, the cable according to claim 2, the power supply tap according to claim 1, the battery according to claim 1, the printed circuit board according to claim 1 or the LSI/IC component according to claim 1, or any other electric component according to claim 1.

<Claim 4>

A method of charging a battery or a battery mounted electric device using the cable according to claim 1, the cable according to claim 2 or the power supply tap according to claim 1, and a battery and a battery mounted electric device charged with the method.

<Claim 5>

A method of charging a battery in the state that any other electric device is connected in energizing to a power supply outlet sourced from a switchboard same to a supply source of the cable or the power supply tap used for charging according to claim 4, and a battery or a battery mounted electric device with the method.

A first aspect of the present invention comprises a means in which a hygroscopic fiber, a hygroscopic resin, an inorganic ion exchanger influence fiber, an inorganic ion exchanger influence resin, a supercritical influence fiber, a supercritical influence resin, or a composite fiber/resin obtained by mixing the above three kinds of fibers/resins is employed as an envelope in a cable, a power supply tap, a battery, a printed circuit board, a LSI/IC component, any other electric component, or any other electric device. Here, the hygroscopic fiber/resin refers to a polymer fiber/resin obtained by polymerizing a carboxyl group or a hydrophilic group of a carboxyl group salt using a natural fiber/resin or a synthetic fiber/resin as a raw material. A second aspect of the present invention comprises a means in which a plurality of cables having different properties are connected in series, including at least one cable using the envelope according to the first aspect as a cable to be used or at least one power supply tap using the envelope according to the first aspect as a power supply tap to be used. A third aspect of the present invention comprises a means in which the cable according to the first aspect, the cable according to the second aspect, the power supply tap according to the first aspect, the battery according to the first aspect, the printed circuit board according to the first aspect, the LSI/IC component according to the first aspect, or any other electric component according to the first aspect is used as a component to be used. A fourth aspect of the present invention relates to a method of charging the battery using the cable according to the first aspect, the cable according to the second aspect, or the power supply tap according to the first aspect in a battery or a battery-mounted electric device. In addition, the fourth aspect relates to a battery or a battery-mounted electric device charged with the method. A fifth aspect of the invention, which improves further the effect of the fourth aspect, relates to a method of charging the battery in the state that any other electric device is connected in energizing to a power supply outlet sourced from a switchboard same to a supply source of the cable or the power supply tap used for charging of the fourth aspect.

Next, fundamental functions which cause fundamental effects of the present invention are described in principle. The first aspect provides not only a negative minus function of causing a noise shielding effect of the shield, but a positive additional function, which is completely new and different, of raising energy level in quantum state of electrons flowing in electric devices or cables. This function is achieved by a hydroscopic fiber, a hydroscopic resin, an inorganic ion exchanger influence fiber, an inorganic ion exchanger influence resin, a supercritical influence fiber, a supercritical influence resin, or a composite fiber/resin obtained by mixing the above three kinds of fibers/resins, and it is a completely new function different from an original hygroscopic property. It is noted that this function is easily realized by affixing even in part the material according to the first aspect such as a hygroscopic fiber, a hygroscopic resin, an inorganic ion exchanger influence fiber, an inorganic ion exchanger influence resin, a supercritical influence fiber, a supercritical influence resin, or a composite fiber/resin obtained by mixing the above three kinds of fibers/resins onto an existing cable, an existing power supply tap, an existing battery, an existing printed circuit board, an existing LSI, an existing IC, any other existing electric component, or any other existing electric device. Further, superconductivity, as a comparison target technology, has a function in which consumed current value is significantly increased by means of ultra-low temperature resulting in non-ecological, whereas the present invention is realized at normal temperature and has an ecological function in completely difference of raising energy efficiency of electrons themselves without changing current value.

The second aspect further improves the function according to the first aspect. A conventional common sense that the shorter is the better about a cable is turned over. That is, by using a cable made longer by connecting in series a plurality of cables with different and excellent performance including at least one cable according to the first aspect, habits of inherent unevenness of frequency properties of energy level in quantum state of cables are averaged resulting in reduction, and every high frequency portions of energy level in quantum state of cables are convolution-integrated to raise energy level in quantum state over the whole frequency properties.

This function is an adverse effect in ordinary cables with low performance as a conventional common sense, whereas this function may be said a distinctive function of the present invention since it appears only when at least one cable according to the first aspect of the present invention is included. In case of an electric device according to the third aspect using the cable according to the first or the second aspect or using the power supply tap, the battery, the printed circuit board, the LSI/IC component or any other electric component according to the first aspect as parts, a function of improving electric or mechanical output energy of the electric device may be comprehensively achieved in comparison to conventional electric devices even in same settings.

Furthermore, in a conventional common sense, it has not been recognized that performance of a battery changes based on quality of a power source such as a cable to charge the battery, whereas it is found that there is a function that performance of the battery charged in first time by a method of charging using the cable according to the first or the second aspect or using the power supply tap according to the first aspect is changeable in a battery or a battery mounted electric device. This is because energy level in quantum state of electrons recorded in the battery is high so that the battery is reformed.

Here, a remarkable point to self-prove a quantum principle function of the present invention is that, in a battery itself, the factor of electrons themselves is only transmitted by a direct current component having no frequency component and thus a quantum state in which energy level of electrons has risen is recorded. As a result, it is possible to obtain an effect of improving output and prolonging use time in the electric device using such battery. This is an event which proves that energy level of quantum state of electrons recorded in the battery rises, and then is transmitted and recorded. This function is in the same degree in both a battery-mounted electric device according to the fourth aspect and an electric device of an AC power supply according to the third aspect.

When a battery is charged using the fourth aspect, by adding the means according to the fifth aspect which is a method of charging the battery in the state that any other electric device is connected in energizing to a power supply outlet sourced from a switchboard same to a supply source of the cable or the power supply tap used for charging, the function of raising energy level in quantum state of electrons is further increased. In the means according to the fifth aspect, the more power consumption of power supplied from the same switchboard, even if it is not going to the battery to be charged, the more energy level of quantum state of electrons going to the battery to be charged rises by being stimulated due to parallel connection. Since this function is not realized in case of connecting any other electric device under general conditions other than the conditions of the fourth aspect, the conditions of the fourth aspect are distinctive requirements in the present invention.

As described above, in the present invention, it is possible to raise energy level of quantum state in electric devices with the above functions as described in detail about each of the first to the fifth aspects by means of a hygroscopic fiber, a hygroscopic resin, an inorganic ion exchanger influence fiber, an inorganic ion exchanger influence resin, a supercritical influence fiber, or a supercritical influence resin.

INDUSTRIAL APPLICABILITY

The electronic reforming method of the present invention has a possibility of being extremely widely applicable to electric devices, in particular, it is widely applicable to electric devices which handles signals having frequency properties. For this reason, it may be effectively applied particularly to electric devices of video system and audio system which are viewed and listened to by humans and to electrical devices of mechanical motor system. Since the power energy to be output increases even when signals having frequency properties are not handled, it is widely and effectively applied to electric devices, which output energy such as light, sound, magnetism, radio wave, heat or ion. In addition, by applying the present invention with a charging means of battery mounted electric devices, there is an extremely wide possibility that it may be applied to all electric devices equipped with batteries. Also, in the age when the quality of electricity is required in association with electricity deregulation, it may be applied as basic technology for improving electric power to supply electric power with better quality.

REFERENCE SIGNS LIST

1: cable body
2: hygroscopic fiber
3: conductive fiber
4: sheath
5: heat shrinkable tube
7: cable
8: connector
11: power supply tap
12: hygroscopic fiber
13: conductive fiber
15: tape
19: housing
21: battery
22: hygroscopic fiber
23: conductive fiber
25: tape
29: housing
31: printed circuit board
32: hygroscopic fiber
33: conductive fiber
35: tape
39: substrate
41: LSI
42: hygroscopic fiber 43: conductive fiber
49: housing
51: electric device assembly
54: internal wiring cable
55: external connecting cable
59: housing
61: high performance cable body
62: conventional cable body with strong low range
63: conventional power supply tap with strong low range
64: conventional cable body with strong middle range
65: conventional power supply tap with strong middle range
66: conventional cable body with high range
67: conventional power supply tap with high range
68: cable body of the first invention having a flat energy level in the entire area
71: charging system
72: switchboard
73: indoor wiring cable
74: wall outlet
75: power supply cable
76: portable device inside charging circuit
77: charging cable
78: wall outlet
79: arbitrary electric device
81: wall outlet
82: power supply cable strong on ultra-low frequency range
83(1), (2), (3), (4), (5), (6), (7): power supply taps
84: power supply cable strong on medium-low frequency range
85: power supply cable strong on medium-high frequency range
86: power supply cable widely strong on medium to ultra-high frequency range
87: improved power supply cable
88: AC outlet
89: charging cable
90: audio player
91: earphone
92: charger attached to Electrically Assisted Pedal Cycle
93: power supply filter
94: high-end audio device with powerful power supply
95: high-end audio device with ultra-high precision clock
M: single wire conductor
I: insulating layer
CA: cable
B: buffer layer
S: shield layer
P: insulating sheath

The invention claimed is:

1. A cable comprising:
an original cable having an insulating sheath as an outermost layer;
a first material provided on the insulating sheath of the original cable; and
a metal sheath provided on the first material and made of aluminum, magnesium, copper, rhodium, silver or gold,
wherein the first material is at least one of a hygroscopic fiber, an inorganic ion exchanger influence fiber, a supercritical influence fiber, and a composite fiber obtained by mixing two or more among the mentioned fibers, and
wherein the first material is impregnated with a silver ion nano-colloidal solution and a tungsten oxide containing solution.

2. The cable according to claim 1, further comprising a conductive fiber provided between the first material and the sheath, wherein the conductive fiber is impregnated with a silver ion nano-colloidal solution and a tungsten oxide containing solution.

3. A method of supplying power to a device or a battery, comprising a step of supplying power to the device or the battery via a cable according to claim 1.

4. The method according to claim 3, further comprising a step of raising flatly auditory energy over the entire audible range by interposing one or more cable with different frequency properties to complement comprehensively auditory frequency properties before the step of supplying power to the cable.

5. A device comprising a battery, wherein the battery is charged by a method according to claim 3.

6. A cable comprising:
an original cable having an insulating sheath as an outermost layer;
a first material provided on the insulating sheath of the original cable; and
a metal sheath provided on the first material and made of aluminum, magnesium, copper, rhodium, silver or gold,
wherein the first material is at least one of a hygroscopic fiber, an inorganic ion exchanger influence fiber, a supercritical influence fiber, a composite fiber obtained by mixing two or more among the mentioned fibers, a hygroscopic resin, an inorganic ion exchanger influence resin, a supercritical influence resin, and a composite resin obtained by mixing two or more among the mentioned resins, and
further comprising a conductive fiber provided between the first material and the sheath, wherein the conductive fiber is impregnated with a silver ion nano-colloidal solution and a tungsten oxide containing solution.

7. A device comprising:
any one of a housing of a power supply tap, a housing of a battery, a housing of an electric part, or a housing of an electric device aggregate; and
a first material provided so as to be in contact with any one of the housings,
wherein the first material is at least one of a hygroscopic fiber, an inorganic ion exchanger influence fiber, a supercritical influence fiber, a composite fiber obtained by mixing two or more among the mentioned fibers, a hygroscopic resin, an inorganic ion exchanger influence resin, a supercritical influence resin, and a composite resin obtained by mixing two or more among the mentioned resins, and
wherein the first material is fixed with a metal thin film tape made of aluminum, magnesium, copper, rhodium, silver or gold.

8. A device comprising:
a substrate; and
a first material provided so as to be in contact with a ground plane exclusive surface of the substrate,
wherein the first material is at least one of a hygroscopic fiber, an inorganic ion exchanger influence fiber, a supercritical influence fiber, a composite fiber obtained by mixing two or more among the mentioned fibers, a hygroscopic resin, an inorganic ion exchanger influence resin, a supercritical influence resin, and a composite resin obtained by mixing two or more among the mentioned resins.

9. The device according to claim 8, wherein the first material is fixed with a metal thin film tape made of aluminum, magnesium, copper, rhodium, silver or gold.

* * * * *